United States Patent [19]

Scholz

[11] 4,363,934
[45] Dec. 14, 1982

[54] VOLUME CONTROL DEVICE

[76] Inventor: Donald T. Scholz, 13 Rich Valley Rd., Wayland, Mass. 01778

[21] Appl. No.: 155,517

[22] Filed: Jun. 2, 1980

[51] Int. Cl.³ .............................................. H03G 9/00
[52] U.S. Cl. ................................................. 179/1 VL
[58] Field of Search ................ 179/1 VL, 1 VE, 1 A, 179/1 R, 1 E, 1 MN; 455/200, 219, 232

[56] References Cited

U.S. PATENT DOCUMENTS 2,525,696 10/1950 Lurie ................................. 179/1 VL
3,033,930 5/1962 Guzskie et al. .................. 179/1 VL
4,143,245 3/1979 Scholz ............................. 179/1 VL Primary Examiner—Joseph A. Popek
Attorney, Agent, or Firm—Wolf, Greenfield & Sacks

[57] ABSTRACT

A circuit for controlling power delivered to an audio speaker to thus control volume output of an electronic music system, maintains the input impedance seen by the driving source within a range close to the speaker impedance. The circuit comprises a ladder control network including a series resistor coupled to the speaker and a switched parallel resistor string. Preferably, the resistor string has multiple taps selectively coupled to the speaker via a multiposition rotary switch for setting incremental relative volume levels. In one embodiment the rotary switch is a single pole switch and a separate switch is employed in series with the resistor string for controlling maximum power delivery to the speaker. In an alternate embodiment the rotary switch is a two pole switch having the second pole in series with the resistor string for controlling maximum power delivery to the speaker.

15 Claims, 4 Drawing Figures

+ 16 OHM SPEAKER
● 8 OHM SPEAKER
○ 4 OHM SPEAKER

—— 16 OHM SPEAKER
— — 8 OHM SPEAKER
— — — 4 OHM SPEAKER

} SINGLE POTENTIOMETER ATTENUATOR

VOLUME CONTROL DEVICE

BACKGROUND OF THE INVENTION

The present invention relates to a volume control apparatus associated with an electronic musical amplifier and speaker. The system of this invention is for maintaining a constant distortion output over the volume range of the speaker system. Furthermore, the system of this invention provides a low cost, high power speaker volume control that may be remotely located from the amplifier. A further characteristic of the present invention is the provision for a relatively simple circuit to accomplish the task and that is quite easy to operate.

My U.S. Pat. No. 4,143,245 shows a volume control arrangement which has worked effectively but has certain disadvantages associated therewith. For example, when connected with a predetermined ohmage speaker, there is provided a separate selector switch that may have to be changed from position to position depending upon the volume setting. This has been found to be a further requirement of the performer that is undesirable. Furthermore, with this power of volume control, in the maximum volume position selected, there is still some power reduction because of a resistance remaining in parallel with the speaker.

Another arrangement that is provided for volume control to a speaker is an attenuating potentiometer which is coupled in parallel with the speaker between the amplifier and the speaker. The problem with this arrangement is that there is a wide variation in the input impedance of the potentiometer and speaker combination as presented to the driving source, typically the output from a power amplifier. Also, as mentioned previously in connection with the volume control described in my patent, in the maximum position there is a power reduction because of resistance in parallel with the speaker.

Another arrangement used to provide volume control to a speaker is an "L" or "T" attenuator circuit. This type of control is inherently expensive because two interconnected potentiometers are required. Also, this type of control does not allow volume settings up to full power of the amplifier because at least one potentiometer is wired in parallel with the speaker in the maximum volume position.

Accordingly, one important object of the present invention is to provide a volume control for a speaker which maintains the input impedance to the control network in approximately the same range as the speaker impedance, or at a desired predetermined impedance. In a worst case condition, the input impedance is maintained to within about 30% to −5% of the speaker impedance.

Another object of the present invention is to provide a volume control that eliminates the use of a potentiometer for volume control. With constant use, potentiometers tend to develop dead spots thus making volume control non-repeatable and non-uniform; also, extreme settings on potentiometers require high current capacities which usually dictate the use of a potentiometer rated to dissipate three or four times the maximum power actually applied to it. This also means, of course, that relatively large size potentiometers are necessary.

Another object of the present invention is thus to provide a volume control for a speaker that is not large and cumbersome and that can be light in weight, packaged in a relatively small container, and that can be made relatively inexpensively.

Still another object of the present invention is to provide a volume control for a speaker that has good heat dissipation characteristics.

SUMMARY OF THE INVENTION

To accomplish the foregoing and other objects of this invention, there is provided a volume control device for use with an amplifier and speaker system adapted for controlling volume output from the speaker while maintaining the input impedance of the device, with the speaker coupled therewith, approximately equal to and within a range small in comparison to the actual speaker impedance, or some desired, predetermined impedance. The device basicly comprises input terminal means for receiving the output signal from the amplifier. This amplifier is typically a power amplifier used in such an amplifier and speaker system. The volume control also includes first impedance means, means coupling the first impedance means in series with the speaker impedance, and second impedance means which includes a variable impedance adapted to be manually set to control volume output from the speaker and having a variable impedance output line that essentially couples directly to the speaker. These first and second impedance means along with the speaker impedance itself essentially forms a ladder-type network with the first impedance means preferably being in the form of a fixed resistor coupled in series with the speaker impedance to form one side of the ladder network, and the second impedance means forming the other side of the ladder network. The fixed resistor in series with the speaker preferably has a value comparable to the value of the speaker impedance. In this regard there is also preferably provided an ohmage selection switch essentially separate from the second impedance means and having at least two positions, in one position switching an additional resistor in parallel with the first impedance means so as to maintain this comparability between the series resistance and the speaker impedance when speakers of different impedance are used. The ohmage selection switch in another position couples a shunt resistor across the speaker impedance for use primarily in the 16 ohm speaker position. The ohmage selection switch preferably also has a separate contact member which in one position changes the impedance of the resistor string. In this regard the variable impedance means of the second impedance includes a resistor string having a plurality of taps, and a volume selection switch having multiple positions corresponding to the resistor string taps. There are also preferably provided end resistors, one at each end of the resistor string for limiting the swing of the input impedance to the volume control. This volume selection switch has a selection contact defining the output node therefrom and a plurality of fixed contacts respectively coupled to the taps of the resistor string.

In one embodiment of the present invention disclosed herein, the volume selection switch is a rotary switch having a single pole. In this embodiment there is also provided a separate switch for selecting operation either via the resistor string or a maximum power position. In an alternate embodiment of the invention disclosed herein, the rotary volume selection switch is a two pole switch having one pole for selecting from the resistor string and a second pole coupled in series with the resistor string for facilitating maximum power delivery to the speaker.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

Figure 1:
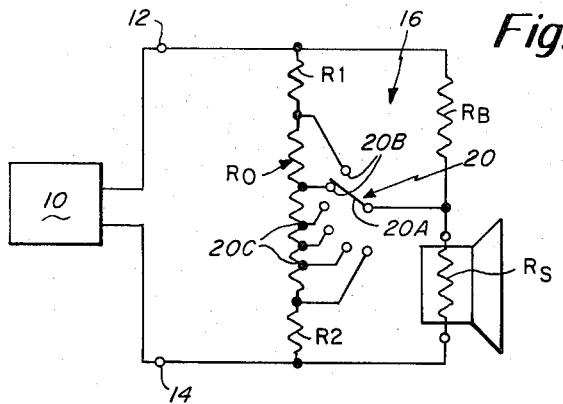
FIG. 1 is a general schematic diagram showing one form of volume control in accordance with the present invention.
Figure 2:
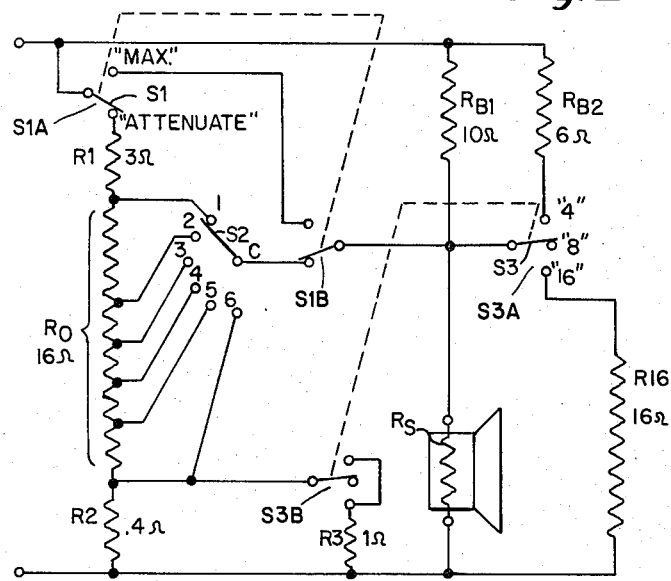
FIG. 2 is a somewhat more detailed schematic employing in addition to the volume selection switch, an ohmage selection switch, and a switch for maximum power.
Figure 4:
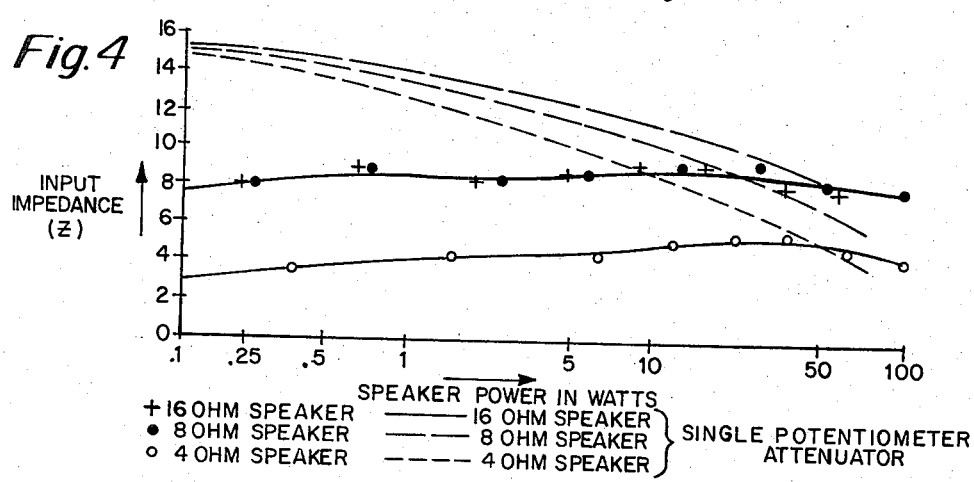
FIG. 4 is graph of input impedance verses speaker power for the embodiment of FIG. 4.

Referring now to the drawing, FIG. 1 is a general circuit diagram showing the control network of the present invention connected between the output of an amplifier and an audio speaker. FIG. 2 is a more complete schematic diagram showing an actual implementation with some additional features not described in the schematic of FIG. 1. FIG. 4 is a graph of speaker volume versus input impedance for an example of an 8 ohm speaker.

FIG. 1 depicts a power amplifier 10 whose output couples to the control network of this invention. FIG. 1 shows the input terminals 12 and 14 which couple to a ladder network 16 having a first leg comprising resistors R1 and R2 connected at opposite ends to a resistor string RO. The other leg comprises a series connected resistor RB which is in series with the speaker as represented by resistor RS. Intercoupling the two legs of the ladder network is a volume control switch 20 having a movable contact 20A that can move selectively between in the example given, seven different output positions 20B. These fixed switch positions 20B in turn couple to fixed taps 20C on the resistor string RO.

In FIG. 1 the resistor RB is used primarily to maintain the input impedance Z at a more constant level as the volume is changed by the selection switch 20. The end resistors R1 and R2, at opposite ends of the resistor string are for preventing extreme impedance swings about the desired input impedance range.

As indicated previously, the ladder network 16 is for maintaining the input impedance Z approximately equal to the speaker impedance RS, as the switch 20 is moved between its maximum and minimum positions. In FIG. 1 the top position of the switch 20 is the maximum position and the bottom position is the minimum position of the switch. With the circuit of this invention the speaker power is controllable from near 0% to on the order of 50-70% of input power, that is, power at terminals 12 and 14. In order to provide full power, a by-pass switch is used, not shown in FIG. 1, but illustrated in the detailed diagram of FIG. 2. The use of a by-pass switch facilitates the connection of the input signal directly to the speaker completely by-passing the resistor string.

In FIG. 1, the resistor R1 is preferably of a value less than the resistance of resistor RB. The resistances of the speaker and resistor RB are approximately of the same order of magnitude. The resistor R2 is substantially smaller than the speaker resistor RS. The total series resistance of resistors RB and RS is less than or approximately equal to the total series resistance of the resistor string RO and resistors R1 and R2.

In the embodiment of FIG. 1, it is noted that the only selection is a volume selection, without there being a requirement for any separate switch for switching between different ohmage speakers. However, another construction is shown in FIG. 2, which shows in detail the control network of this invention. In essence, the resistor RB of FIG. 1 is replaced by two parallel resistors RB1 and RB2 of respective values 10 ohms and 6 ohms. There is also added an additional resistor R16 adapted to be connected across the speaker in one mode of operation. FIG. 2 shows the resistor string RO with the end resistors R1 and R2. There is also provided one other small resistor R3 which under certain conditions described hereinafter, is disposed in parallel with resistor R2. In FIG. 2 the switch 20 described previously in FIG. 1 is identified as switch S2. Switch S2 has a common terminal S2C and switchable output terminals S2-1, S2-2, S2-3, S2-4, S2-5 and S2-6.

In addition to the seven position rotary switch S2, there is a by-pass switch S1 which includes separate contacts S1A and S1B. The switch S1 is a single-pole double-throw switch which in one position indicates maximum power transfer to the speaker and in the other position essentially couples the input power to the resistor string RO with its end resistors R1 and R2. In the maximum position of switch S1, the input power is essentially coupled by way of both sets of contacts S1A and S1B to the common contact of switch S3.

The switch S3 is a three-position double-poled switch which has a center off position. The switch S3 has three positions corresponding to the three common ohmage speakers. Thus, in FIG. 2 the top position is referred to as the "4" ohmage position, the middle position as the "8" ohmage position and the lower as the "16" ohmage position. A similar designation is used with respect to the contact S3B. The contact S3B is maintained open except in its "4" ohmage position in which case the resistors R2 and R3 are coupled in parallel. These resistors in parallel makes a resulting resistance of 0.29 ohm. This is advisable in the "4" ohm position when using a "4" ohm speaker in order to sufficiently extend the volume range at the lower end.

The switch S3 may be referred to as the speaker impedance selector. In its "4" ohmage position, resistors RB1 and RB2 are essentially connected in parallel to provide a resultant resistance of 3.75 ohms. In the intermediate "8" ohm position, the switch S3 is essentially off thus inserting only resistor RB1 in the circuit. Resistor RB2 is out of the circuit in that position. Finally, in the "16" ohm position of switch S3 the resistor R16 is placed in parallel with the speaker resistance RS, resulting in a parallel equivalent resistance of 8.0 ohms. Thus, the input impedance is identical to that found when using an 8 ohm speaker.

As mentioned previously, the by-pass switch S1 connects full power to the speaker; that is, except when the switch S3 is in its "16" ohm position, in which case the resistor R16 is placed in parallel with the speaker with the speaker also being a "16" ohm speaker, the power supplied to the speaker is actually cut in half by virtue of the insertion of the resistor R16. This protects the "16" ohm speaker from overloading as such a speaker is not usually rated to carry 100 watts which is a common amp rating. Resistor R16 may be somewhat larger than 16 ohms, but it should be small enough to limit the maximum power to the speaker.

In FIG. 2 the resistor string RO may be of the adjustable tap type or may be constructed from several separate fixed resistors. These taps are chosen to provide approximately the attenuation shown in the following chart.

| S1 | S2 | CHART FOR POWER DELIVERED TO SPEAKER VS. SWITCH POSITION | |
|---|---|---|---|
| | | SPEAKER POWER AT 100W INPUT | RELATIVE VOLUME |
| "MAX" | (Any) | 100-W | 0db |
| "Atten." | 1 | 50-W | -3 |
| | 2 | 25-W | -6 |
| | 3 | 12-W | -9 |
| | 4 | 6-W | -12 |
| | 5 | 3-W | -15 |
| | 6 | 1-W | -20 |
| | 7 | ¼-W | -26 |

In this chart it is noted that the relative volume is preferably selected at about 3 db apart. The actual attenuation will vary slightly depending upon the ohmage setting with regard to switch S3 but the steps will still roughly be approximately 3 db apart.

As indicated in FIG. 2, the resistor values, are as designated. Thus, resistor R1 is a "3" ohm resistor and resistor R2 is a 0.4 ohm resistor. The resistor string R0 has a total resistance of 15.8 ohms. The other resistors have been discussed previously as far as their designated value is concerned.

Figure 3:
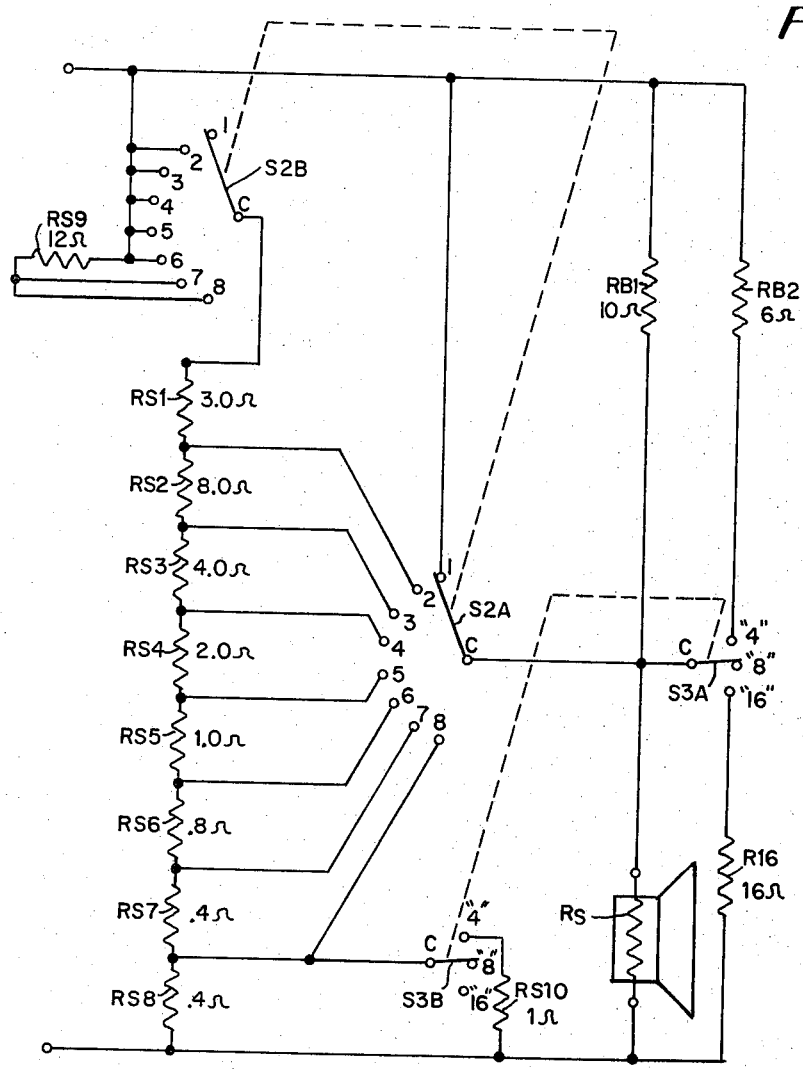
FIG. 3 is another embodiment of the present invention shown in a circuit diagram having substantially the same features as the circuit shown in FIG. 2 but somewhat simplified in that it incorporates only two separate switches.

FIG. 3 is a circuit arrangement which may be preferred over the circuit previously shown and discussed in FIG. 2. These two embodiments differ primarily in that the switch S1 of FIG. 2 is eliminated and replaced by a second pole provided on the switch S2 of FIG. 2. Thus, in the embodiment of FIG. 3 there is shown the eight position rotary switch S2 comprising poles S2A and a separate pole S2B. The pole S2A has eight output contacts coupled to the resistor string in a manner previously described with regard to FIG. 2. The common side of the switch pole S2A couples to the speaker as represented in FIG. 3 by the speaker resistance RS. The second pole S2B of the rotary switch similarly has a common contact S2B-C that couples to the top end of the resistor string. In FIG. 3 the resistor string is identified by eight separator resistors RS1, RS2, RS3, RS4, RS5, RS6, RS7 and RS8. FIG. 3 also shows the specific ohmage of values of each of these resistors. It is noted that generally speaking, the resistor values decrease from a higher value at the top to lower values at the bottom of the resistor string. The selectable eight contacts of the pole S2B may couple in parallel with a common connection to one of the input terminals. However, in the embodiment of FIG. 3 there is provision for one other resistor RS9 which is inserted in series with the resistor string in predetermined positions of the rotary switch.

The resistor RS9 may be replaced by a jumper, or in other words considered as being zero resistance. If resistor RS9 is zero impedance then the circuit of FIG. 3 behaves substantially in the manner as depicted in the graph of FIG. 4 and as previously explained in the chart shown herein before. If the resistor R9 is selected at a value greater than zero then the resistors RB1 and RB2 may be reduced in value resulting in a more nearly constant input impedance without effecting the volume control capability. There is now disclosed in FIG. 3 values for substantially all resistors. For example, resistor RB1 is a 10 ohm resistor, resistor RB2 is a 6 ohm resistor and resistor R16 is a 16 ohm resistor.

It is also noted in FIG. 3 that the lowermost resistor RS8 of the resistor string has a value the same as the resistor R2 shown in FIG. 2. In this instance it is a 0.4 ohm resistor. The resistor that may be placed in parallel with this resistor, namely resistor RS10 is a 1 ohm resistor. This resistor RS10 is coupled to one of the selectable positions of the switch pole S3B. As in the embodiment of FIG. 2, the resistor RS10 is only switched across resistor RS8 of the resistor string in the "4" ohmage position of the switch S3. It is also noted that the other pole S3A of the switch S3 is connected identically with the connection previously shown in FIG. 2.

FIG. 4 clearly illustrates the objective of the present invention of equalizing the input impedance. In FIG. 4 the discrete points indicate the input impedance with the device of the present invention for the three different speaker values. Also shown in FIG. 4 employing dash lines are the impedance values for the three different ohmage speakers when employing a single potentiometer circuit. FIG. 4 also includes minimum and maximum impedance values associated with the control of the present invention.

With reference to FIG. 3, in the selected "4" ohm position for the switch S3, the combined resistance of resistors RS8 and RS10 in parallel provides a 0.29 ohm resistance. The speaker resistance is 4 ohms, and the combined resistance by the two resistors RB1 and RB2 in parallel provides a total resistance of 3.75 ohms. The input impedance can be calculated for the minimum and maximum volume settings and also for a mid-range setting. The input impedance is actually at a maximum at a mid-range setting as depicted in FIG. 4.

At the minimum volume setting which is position 8 of switch S2, the input impedance is calculated at 3.8 ohms for the 4 ohm speaker. At the maximum volume setting the impedance is 4.0 ohms. At a mid-range setting such as position 2 the impedance is about 5.5 ohms. Thus, the input impedance for the 4 ohm example may be expressed by the following formula:

$$Z = 4.55 \pm 0.95 \text{ ohms}$$

Similarly, for an 8 ohm speaker the minimum speaker volume input impedance is calculated as 7.9 ohms. The input impedance for the maximum speaker volume is 8.0 ohms. The maximum input impedance at mid-range (position 2) was calculated at 9.4 ohms. Thus, for the 8 ohm speaker, the input impedance may be expressed for the following formula:

$$Z = 8.65 \pm 0.75 \text{ ohms}$$

FIG. 4 is a graph of speaker power versus input impedance. It is noted in the graph that the discrete points represent the design of the present invention while the dash lines represent the prior art design using a potentiometer as an attenuator. It is noted that the dash lines show a wide range of input impedance while the input impedance for the control circuit of the present invention extends about the impedance value corresponding to the ohmage of the speaker being used. For an 8 ohm speaker, at the low speaker volume setting, it is noted that the input impedance is just below 8 ohms. At midrange the input impedance peaks to about 9.4 ohms. At the ½ speaker volume setting the impedance again reverts to about an 8.0 ohm value.

Having described a limited number of embodiments of this invention, it is now contemplated that numerous other embodiments may be contemplated all of which are considered as falling within the scope of this invention as defined by the appended claims. The described embodiments herein include the preferred embodiment shown in FIG. 3 which replaces the two switches S1 and S2 with a double pole switch having poles S2A and S2B along with the addition of one additional resistor R9. This requires fewer manipulations by the operator.

What is claimed is:

1. A volume control device for an amplifier and speaker system adapted for controlling the volume output level from the speaker while maintaining the input impedance of the device, with the speaker coupled therewith, within a constant impedance range near the actual speaker impedance or a predetermined impedance, said device comprising:
   input terminal means for receiving an output signal from the amplifier,
   first impedance means,
   means coupling the first impedance means in series with the speaker impedance across the input terminal means,
   second impedance including variable impedance means adapted to be manually settable to control volume output level from the speaker and having a variable impedance means output node,
   means coupling the second impedance means in parallel with the series connection of the first impedance means and the speaker impedance,
   and means coupling the variable impedance output node to a junction point between the series connection of the first impedance means and the speaker impedance.

2. A volume control device as set forth in claim 1 wherein said first impedance means includes a fixed resistor coupled in series with the speaker impedance.

3. A volume control device as set forth in claim 2 wherein the fixed resistor has a value comparable to the value of the speaker impedance.

4. A volume control device as set forth in claim 1 wherein the variable impedance means includes a resistor string having a plurality of taps, and a volume selection switch having multiple positions corresponding to the resistor string taps.

5. A volume control device as set forth in claim 4 wherein the second impedance means further includes end resistors, one at each end of the string.

6. A volume control device as set forth in claim 5 wherein the selection switch has a selection contact defining the output node and a plurality of fixed contacts respectively coupled to the taps of the resistor string.

7. A volume control device as set forth in claim 1 including a maximum power switch having one position for coupling input power to the second impedance means, and another position by-passing the second impedance means and coupling input power directly across the speaker.

8. A volume control device as set forth in claim 1 including switch means having one position for coupling input power to the second impedance means, and another position by-passing the second impedance means and coupling input power directly across the speaker.

9. A volume control device as set forth in claim 8 wherein said second impedance means comprises a rotary switch having first and second poles, a second pole thereof for coupling the power directly across the speaker.

10. A volume control device as set forth in claim 8 wherein said switch means includes a maximum power selection switch operable independently of the rotary switch.

11. A volume control device as set forth in claim 1 wherein said first impedance means, speaker impedance and second impedance means form a ladder network with said second impedance means having complementary variable impedance sections.

12. A volume control device for an amplifier and speaker system adapted for controlling the volume output level from the speaker while maintaining the input impedance of the device with the speaker coupled therewith, with constant impedance range near the actual speaker impedance or a predetermined impedance, said device comprising:
   input terminal means for receiving an output signal from the amplifier,
   first impedance means,
   means coupling the first impedance means in series with the speaker impedance across the input terminal means,
   second impedance means including variable impedance means manually settable to control volume output level from the speaker and having a variable impedance output node,
   means coupling the variable impedance means in parallel with at least the speaker,
   means coupling the variable impedance output node to a junction point between the first impedance means and the speaker impedance,
   and an ohmage selection switch having at least two positions, in one position switching an additional resistor in parallel with the first impedance means.

13. A volume control device as set forth in claim 12 including a shunt resistor, said ohmage selection switch in another position coupling the shunt resistor across the speaker impedance to reduce speaker loading.

14. A volume control device as set forth in claim 13 wherein said ohmage selection switch has a separate contact member which in one position changes the impedance of the second impedance means.

15. A volume control device for an amplifier and speaker system adapted for controlling the volume output level from the speaker while maintaining the input impedance of the device with the speaker coupled therewith, with constant impedance range near the actual speaker impedance or a predetermined impedance, said device comprising:
   input terminal means for receiving an output signal from the amplifier,
   first impedance means,
   means coupling the first impedance means in series with the speaker impedance across the input terminal means,
   second impedance means including variable impedance means manually settable to control volume output level from the speaker and having a variable impedance output node, means coupling the variable impedance means in parallel with at least the speaker,
means coupling the variable impedance output node to a junction point between the first impedance means and the speaker impedance,
said first impedance means, speaker impedance and second impedance means forming a ladder network with said second impedance means having complimentary variable impedance sections,
wherein one of said impedance sections is in parallel with the first impedance means and the other impedance section is in parallel with the speaker.

* * * * *